(12) United States Patent
Lehmann et al.

(10) Patent No.: US 6,809,972 B2
(45) Date of Patent: Oct. 26, 2004

(54) CIRCUIT TECHNIQUE FOR COLUMN REDUNDANCY FUSE LATCHES

(75) Inventors: Gunther Lehmann, Munich (DE); Gerd Frankowsky, Hoehenkirchen-Siegertsbrunn (DE)

(73) Assignee: Infineon Technologies AG (DE)

( * ) Notice: Subject to any disclaimer, the term of this patent is extended or adjusted under 35 U.S.C. 154(b) by 62 days.

(21) Appl. No.: 10/387,993

(22) Filed: Mar. 13, 2003

(65) Prior Publication Data

US 2004/0179412 A1 Sep. 16, 2004

(51) Int. Cl.$^7$ ................................................. G11C 7/00
(52) U.S. Cl. ............... 365/200; 365/225.7; 365/230.08; 365/185.25
(58) Field of Search ............................. 365/200, 225.7, 365/230.08, 185.25

(56) References Cited

U.S. PATENT DOCUMENTS

| | | | |
|---|---|---|---|
| 4,727,516 A | 2/1988 | Yoshida et al. | |
| 4,837,747 A | 6/1989 | Dosaka et al. | |
| 5,461,586 A | * 10/1995 | Nasu | ........................ 365/200 |
| 5,544,113 A | 8/1996 | Kirihata et al. | |
| 5,555,212 A | 9/1996 | Toshiaki et al. | |
| 5,970,000 A | 10/1999 | Kirihata et al. | |
| 6,016,265 A | 1/2000 | Yoshida et al. | |
| 6,166,981 A | 12/2000 | Kirihata et al. | |
| 6,285,619 B1 | 9/2001 | Daniel et al. | |
| 6,384,666 B1 | 5/2002 | Bertin et al. | |

* cited by examiner

Primary Examiner—Van Thu Nguyen
Assistant Examiner—Pho M. Luu
(74) Attorney, Agent, or Firm—Lerner, David, Littenberg, Krumholz & Mentlik, LLP

(57) ABSTRACT

Address information representing failed elements in an array portion of a device is delivered. Respective fail address bit values are stored in a plurality of fuses. A signal associated with a respective value of a portion of a further address is received. When the signal is received, one of the fail address bit values is delivered from one of the fuses to a corresponding latch circuit. The latch circuit receives fail address bit values from at least two of the fuses. One of the fail address bit values is selected based on the value associated with the signal. The latch circuit is activated to deliver the fail address bit value.

27 Claims, 10 Drawing Sheets

| ROW ADDRESS <12> | 1 | | 0 | |
|---|---|---|---|---|
| ROW ADDRESS <11> | 1 | 0 | 1 | 0 |
| ROWINFO | 3 | 2 | 1 | 0 |

CIRCUIT TECHNIQUE FOR COLUMN REDUNDANCY FUSE LATCHES

BACKGROUND OF THE INVENTION

The present invention is directed to electronic devices and, more particularly, to repairable electronic devices that include redundant cells for replacing defective cells, such as are used in semiconductor memory devices.

Semiconductor memory devices, such as dynamic random access memory devices (DRAMs), typically include a semiconductor memory cell array formed of a plurality of memory cells arranged in rows and columns and include a plurality of bit lines as well as a plurality of word lines that intersect the bit lines. Each memory cell of the array is located at the intersection of a respective word line and a respective bit line and includes a capacitor for storing data and a transistor for switching, such as a planar or vertical MOS transistor. The word line is connected to the gate of the switching transistor, and the bit line is connected to the source or drain of the switching transistor. When the transistor of the memory cell is switched on by a signal on the word line, a data signal is transferred from the capacitor of the memory cell to the bit line connected to the memory cell or from the bit line connected to the memory cell to the capacitor of the memory cell.

When data stored in one of the memory cells is read onto one of the bit lines, for example, a potential difference is generated between the bit line of the respective memory cell and the bit line of another memory cell which form a bit line pair. A bit line sense amplifier connected to the bit line pair senses and amplifies the potential difference and transfers the data from the selected memory cells to a data line pair.

As the capacity of semiconductor memory devices increases, the likelihood that a device includes one or more defective memory cells also increases, thereby adversely affecting the yield of the semiconductor memory device manufacturing processes. To address this problem, redundant memory cells are provided which can replace memory cells that are found to be defective during device testing. Typically, one or more spare rows, known as row redundancy, and/or one or more spare columns, known as column redundancy, are included in the memory cell array. The spare rows and/or columns have programmable decoders that can be programmed to respond to the address of the defective row and/or column while at the same time disabling the selection of the defective cell. The address of the defective memory cell is programmed into the fuse programmable decoder by blowing one or more appropriate fuses in a redundancy control circuit. When an address corresponding to a defective memory cell is received, the redundant memory cell is selected so that the word line or bit line that is connected to the redundant memory cell is substituted for the word line or bit line that is connected to the defective memory cell. As a result, the repaired memory device chip cannot be readily distinguished, at least electrically, from a defect-free chip.

To read the address of the defective memory cell stored in the fuses, at least one fuse latch is required to read and store the state of each fuse. Because the column and row addresses of current DRAM memory circuits may be thirteen bits or more, thirteen fuses or more and thirteen or more fuse latches may be needed to define the row address of a defective memory cell. As a result, the area of the support section of the memory device is significantly increased to store all of the redundancy information.

Alternatively, fewer fuses and fuse latches are used and represent only the most significant bits of the column address of the defective cell. As an example, the 10 most significant bits of a thirteen bit address are stored as fuses and readout by the fuse latches, and the least significant 3 bits are not stored. As a result, the column address stored by the fuses represents not only the column address of the defective memory cell but also represents up to 8 columns that have addresses with the same 10 most significant bits. As a result, not only is the column having defective cell replaced by a redundant column, but all 8 columns of cells are replaced by redundant columns.

To improve the granularity of the redundant memory cells, namely to decrease the number of redundant memory cells that must be used when a defective memory cell is to be replaced, each column of the array is divided by dividing the array into sub-arrays, and row address information representing the sub-array of the defective memory cell is applied to the output of the fuse latches. However, additional latches are required to read the additional data. Moreover, two pre-charge and readout cycles are required to read both sets of fuse latches.

It is therefore desirable to provide redundant bit lines with improved granularity in a manner that requires fewer fuse latches and fewer pre-charge/readout cycles.

SUMMARY OF THE INVENTION

The present invention provides a circuit and a method for providing column redundancy of a DRAM circuit by reading the values stored in the fuses that represent the row address of a failed memory cell only when the row address is to be read so that fewer fuse latches are required and only one pre-charge/readout cycle is needed.

In accordance with an aspect of the invention, address information representing failed elements in an array portion of a device is delivered. Respective fail address bit values are stored in a plurality of fuses. A signal associated with a respective value of a portion of a further address is received. When the signal is received, one of the fail address bit values is delivered from one of the plurality of fuses to a corresponding latch circuit. The latch circuit is operable to receive fail address bit values from at least two of the plurality of fuses. One of the fail address bit values is selected based on the value associated with the signal. The latch circuit is activated to deliver the fail address bit value.

In accordance with another aspect of the invention, a circuit delivers address information representing failed elements in an array portion of a device. A plurality of fuses are each operative to store a respective fail address bit value. Plural signal lines are each associated with a respective value of a portion of a further address. A plurality of switches each have an input terminal coupled to a corresponding fuse, a control terminal coupled to an associated signal line, and an output terminal. One or more latch circuits have a first input coupled to the output of at least two of the switches and an second input coupled to a pre-charge line. When a signal is delivered over a respective signal line to the gate terminal of the associated switch, one of the fail address bit values is delivered from one of the two or more fuses to the first input of the latch circuit. When a pre-charge signal is then delivered over the pre-charge line to the second input of the latch circuit, the fail address bit value is outputted by the latch circuit.

In accordance with a further aspect of the invention, a memory circuit includes a memory array, a control circuit operable to receive at least one row address value and at least one column address value, a word line controller operable to receive the row address value from the control circuit and to activate a row of the memory array corresponding to the row address value, a bit line controller operable to receive the column address value from the control circuit, a generator circuit operable to receive the row address value from the control circuit and to generate a further value based on a portion of the row address value, and a fuse latch circuit. The fuse latch circuit includes a plurality of fuses each operative to store a respective fail address bit value, a plurality of signal lines each associated with a respective one of the further values, a plurality of switches each having an input terminal coupled to a corresponding one of the plurality of fuses as well as a control terminal coupled to an associated one of the plurality of signal lines and an output terminal, and a plurality of latch circuits each of which has a first input coupled to the output of at least a corresponding two of the plurality of switches and a second input coupled to a pre-charge line. When a signal is delivered over a respective signal line to each gate terminal of associated ones of the switches, a respective fail address bit value is delivered to the first input of each of the latch circuits from one of its corresponding fuses. When a pre-charge signal is then delivered over the pre-charge line to each second input of the latch circuits, each of the latch circuits delivers its respective fail address bit value to the bit line controller. The bit line controller activates a column of the memory array corresponding to the column address value when a fail address comprised of the fail address bit values differs from the column address value. The bit line controller actives a redundant column line of the memory array when the fail address is the column address value.

The foregoing aspects, features and advantages of the present invention will be further appreciated when considered with reference to the following description of the preferred embodiments and accompanying drawings.

DETAILED DESCRIPTION

Figure 1:
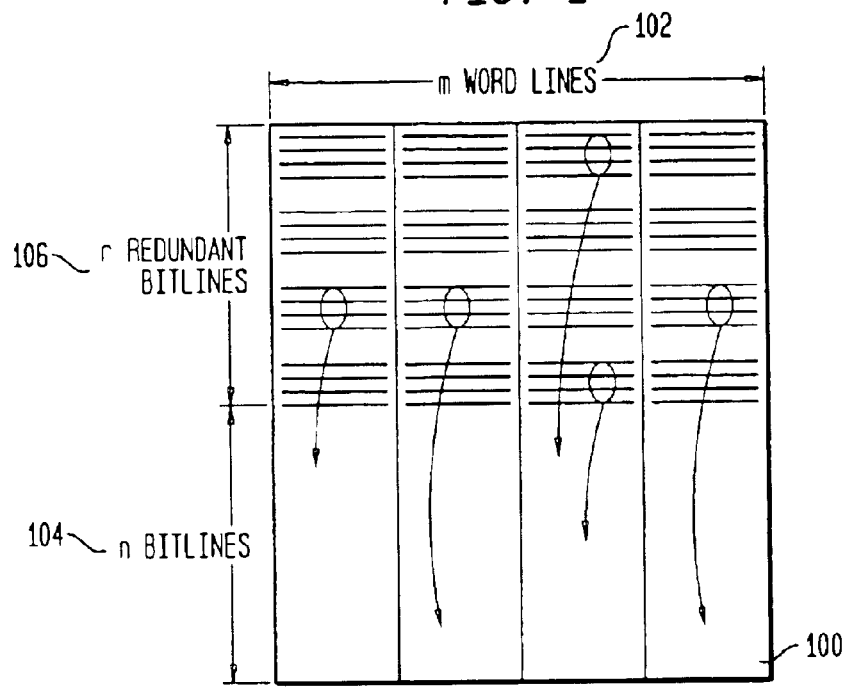
FIG. 1 is a diagram showing an example of an arrangement of bit lines and word lines in a memory cell array together with its redundant bit lines.

FIG. 1 shows an example of a memory cell array portion 100 of a DRAM. The memory cell array 100 is formed of m word lines 102 and n bit lines 104. Also provided are r redundant bit lines 106 divided into sub-arrays which may be used to replace corresponding portions of defective bit lines of the n bit lines 104.

Figure 2:
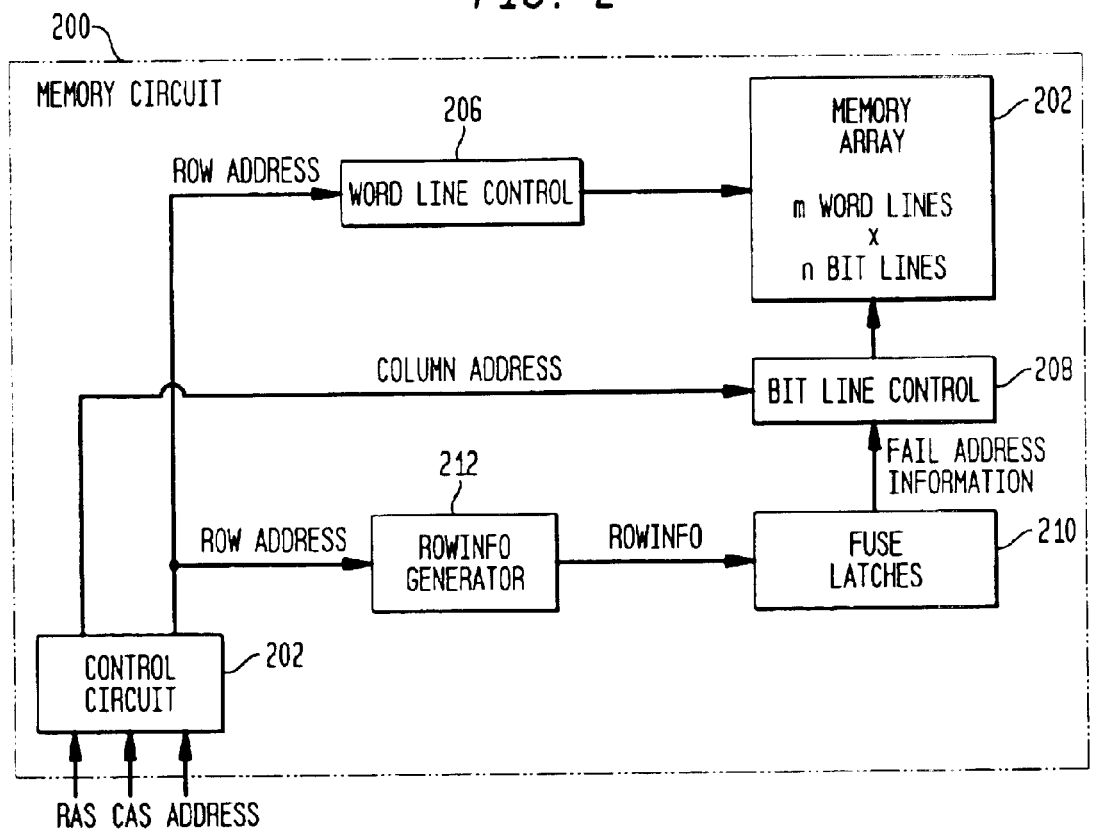
FIG. 2 is a block diagram showing the elements of a memory circuit.

FIG. 2 shows a memory circuit 200 of a DRAM that writes data to or reads data from respective memory cells of a memory array 202 as a function of received row and column addresses. Preferably, all of the elements shown in FIG. 2 are formed on a common semiconductor substrate though, at the very least, only the memory array 202 is formed on a single substrate.

Figure 3:
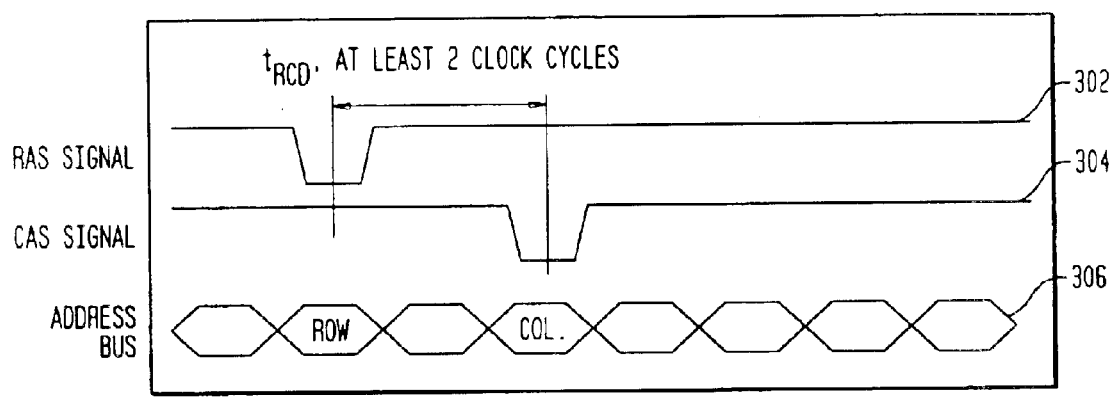
FIG. 3 is a timing diagram of the row address strobe (RAS) signal and the column address strobe (CAS) signal as a function of the clock cycles of the memory circuit.

A control circuit 204 receives, via an address bus, the row and column address of at least one cell of the memory cell array 202 that is to be accessed. The row address and the column address of the memory cell are received sequentially at respective clock cycles under the control of row address strobe (RAS) signals and column address strobe (CAS) signals which are also received by the control circuit 204. As FIG. 3 shows, the row address is delivered to the control circuit during a clock cycle in which the RAS signal 302 is held active, and then the column address signal is delivered to the control circuit during a clock cycle in which the CAS signal 304 is held active. Typically, the column address is delivered over the address bus 306 at least two clock cycles after the row address is delivered.

Referring back to FIG. 2, the row address is then delivered to a word line control circuit 206 which drives a selected word line based on the row address signal. The control circuit also delivers the column address to a bit line control circuit 208 which drives a selected bit line as a function of the column address signal. The control circuit 204 also delivers the row address to a ROWINFO generator circuit 212 which delivers ROWINFO data to the fuse latches 210 based on the row address. The fuse latches 210, in turn, generate fail address information, which is generated from data stored in fuses as well as from the ROWINFO signal, and delivers the fail address information to the bit line controller 208 to indicate whether portions of one or more of the selected bit lines have failed and are to be replaced with portions of redundant bit lines. When the bit line controller 208 receives a column address from the control circuit 204 that the fail address information signals indicate is defective, the bit line controller 208 instead activates one or more portions of the redundant bit lines in place of the defective bit lines using the fail address information.

Figure 4:
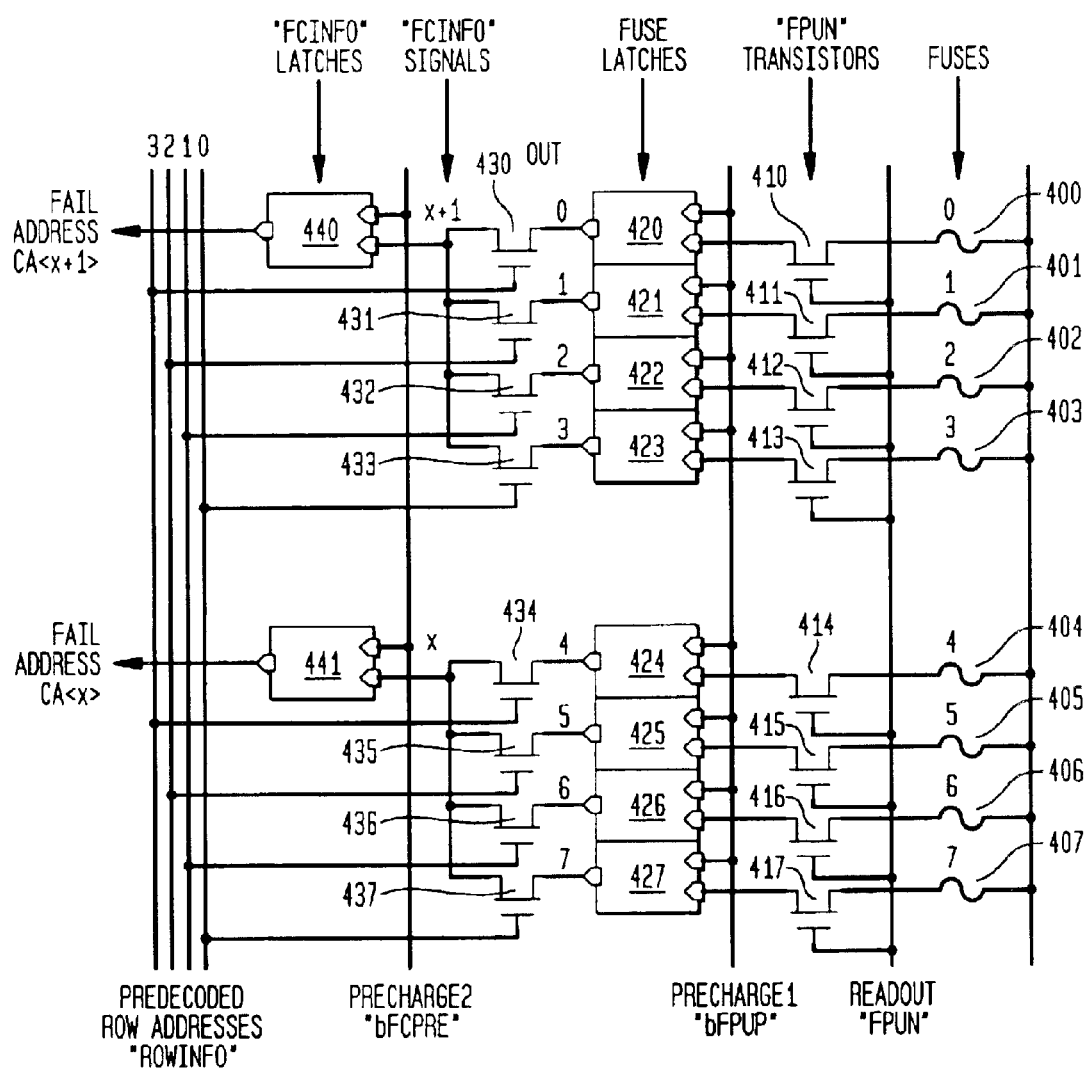
FIG. 4 is a diagram showing a known arrangement of fuses and column fuse latches for storing and reading out fail address information.

FIG. 4 illustrates a known fuse latch arrangement. A plurality of fuses 400, 401, 402, . . . are programmed to represent the respective bits of fail addresses by defining one of a 0 or 1 value as a fuse in a blown or open state, and the other of the 0 and 1 values as a fuse in an unblown or shorted state. Each of the fuses 400, 401, 402, . . . is connected to a terminal of a corresponding FPUN transistor 410, 411, . . . , each of which, in turn, has another terminal that is coupled to an input of a corresponding fuse latch 420, 421, . . . . A gate terminal of each FPUN transistor is connected to a readout strobe input FPUN so that when the FPUN transistor is activated, a connection is provided between its corresponding fuse and its corresponding fuse latch.

A first pre-charge line bFPUP is connected to another input of each of the fuse latches 420, 421, . . . and, during power-up, pre-charges each of the fuse latches when the first pre-charge input bFPUP is activated. When the readout strobe FPUN is turned on, the two terminals of the FPUN transistors 410, 411, . . . are closed so that when a fuse is in an unblown or shorted state, the charge stored in the corresponding fuse latch is discharged through the fuse to a ground terminal and inverts the output of the fuse latch. Alternatively, when the fuse is in a blown or open state, then the charge stored in the fuse latch is not discharged through the fuse, and the output of the fuse latch remains in its original state.

The outputs of each of the fuse latches 420, 421, 422, 423 are each coupled to a terminal of its corresponding output transistor 430, 431, 432, 433 each of which has a further terminal that is connected to an input of a further FCINFO latch 440. The gate terminal of each of the output transistors 430, 431, 432, 433 is connected to a corresponding one of the ROWINFO lines so that when one of the ROWINFO lines is activated, a connection is provided across its corresponding transistor and delivers an output from a selected one of the fuse latches 420, 421, 422, 423 to an input of the FCINFO latch 440.

A further pre-charge line bFCPRE is connected to the other input of the FCINFO latch 440 and pre-charges the FCINFO fuse latch. When the ROWINFO signal is delivered over one of the ROWINFO lines, a corresponding one of transistors 430, 431, 432, 433 is activated and causes FCINFO fuse latch 440 to generate a fail address output bit CA<x+1>.

The outputs of fuse latches 424, 425, 426, 427 are each similarly coupled to a terminal of a corresponding transistor 434, 435, 436, 437 which, in turn, has a further terminal which is coupled to an input of FCINFO fuse latch 441. The gate terminal of each of the transistors 434, 435, 436, 437 is connected to a corresponding one of the ROWINFO lines. When one of the ROWINFO lines is activated, one of the transistors 434, 435, 436, 437 is activated to deliver the output of its corresponding fuse latch 424, 425, 426, 427 to FCINFO latch 441. The further pre-charge line bFCPRE charges the FCINFO latch 441 and causes the FCINFO latch 441 to generate fail address output CA<x>. Though only two outputs are shown, as many outputs as are needed to define all of the fail address bits are provided, with corresponding fuses, latches and transistors.

Figure 5:
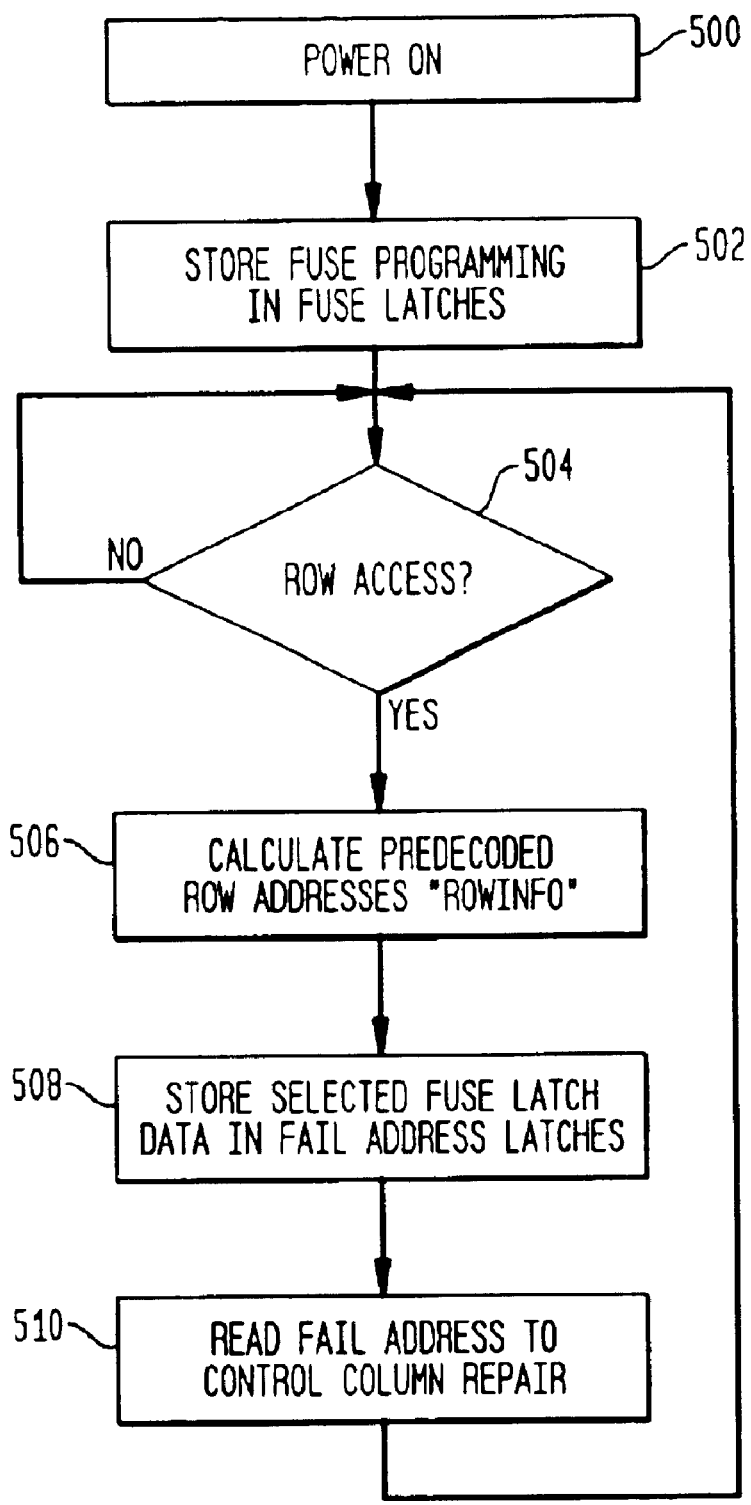
FIG. 5 is a flow chart illustrating the operation of the circuit shown in FIG. 4.

FIG. 5 illustrates the sequence of operations of the fuse latch arrangement shown in FIG. 4. First, as shown at step 500, the fuse latches 420, 421, . . . are pre-charged by first pre-charge line bFPUP. Then, a strobe input is delivered along readout line FPUN to activate each of the FPUN transistors 410, 411, . . . to cause each fuse latch to store the programmed values stored in each fuse by its blown or unblown state.

Next, as shown at step 504, it is determined whether a row address of a memory cell has been received by the control circuit 204, shown in FIG. 2. If no row address has been received, the memory circuit waits until such an address is received. Alternatively, when a row address is received, the generator circuit 212 generates a ROWINFO value based on the received row address, as shown at step 506.

Figure 6:
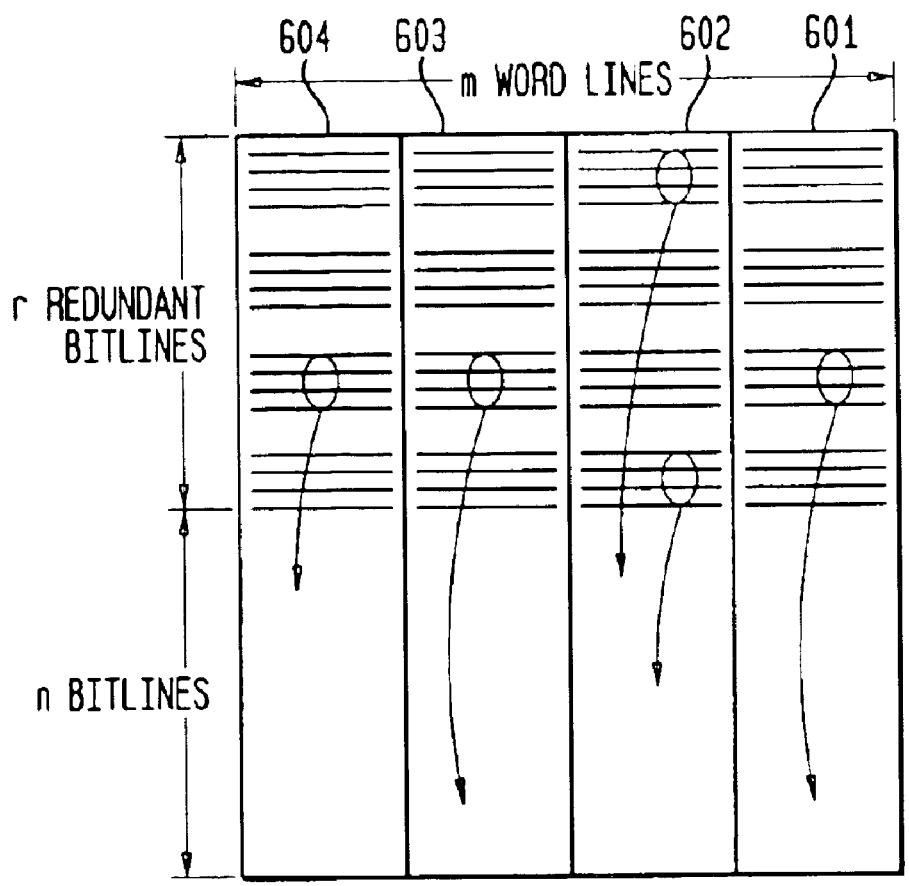
FIG. 6 is a diagram showing an example of the relation between row address values and ROWINFO values for a memory cell array.

FIG. 6 illustrates an example of how the ROWINFO value is defined and used to increase the granularity of the replacement bits. Ordinarily, when a defective memory cell is found in a bit line, the entire bit line is replaced with an entire redundant bit line. The ROWINFO values, when used in conjunction with the address of the defective bit line, permit the replacement of only a portion of the bit line that has the defect with a corresponding portion of a redundant bit line while the remaining, defect-free portion of the bit line remains in operation. As an example, the memory array shown in FIG. 6 is divided into four sub-arrays as a function of bits <11> and <12> of a thirteen bit row address. The values of the two bits are added to define the ROWINFO value. Thus, sub-array 601, for which row address bit <12> has value of 0 and a row address bit <11> has a value of 0, has a ROWINFO value of 0. Sub-array 602, for which row address bit <12> has value of 0 and row address bit <11> has a value of 1, has a ROWINFO value of 1. Similarly, sub-array 603 has a ROWINFO value of 2, and sub-array 604 has a ROWINFO value of 3.

Though the example shown in FIG. 6 shows the memory array divided into four sub-arrays, the memory array may alternatively be divided into a fewer or greater number of sub-arrays. As an example the memory array may be divided into two sub-arrays using only two ROWINFO bits or into eight subarrays using eight ROWINFO bits. Other divisions are also possible using only some of the 2,4 or 8 possible ROWINFO values.

Referring back to FIG. 5, the output of one of every four fuse latches is selected using the ROWINFO value, as shown at step 508. As shown in FIG. 4, each of the four possible ROWINFO values is represented by a respective signal line that is connected to a corresponding gate of every fourth transistor 430, 431, . . . As an example, when the ROWINFO value is 0, the "0" ROWINFO line is activated which activates the transistors 433 and 437 respectively so that the output of fuse latches 423 and 427 are respectively delivered to FCINFO latches 440 and 441. Similarly, when the ROWINFO value is 1, the ROWINFO line "1" is activated which activates transistors 432 and 436 so that the outputs of fuse latches 422 and 426 are respectively delivered to FCINFO latches 440 and 441. Likewise, when the ROWINFO value is 2, the ROWINFO line "2" and the transistors 431 and 435 are activated, and the outputs of fuse latches 421 and 425 are delivered to the FCINFO latches 440 and 441, respectively. Further, when the ROWINFO value is 3, the ROWINFO line "3" and the transistors 430 and 434 are activated and the outputs of fuse latches 420 and 424 are delivered to the input of the FCINFO latches 440 and 441, respectively.

Next, as shown at step 510 of FIG. 5, the second pre-charge signal bFCPRE is delivered to the other input of the FCINFO latches 440, 441 to deliver fail addresses CA<x+1> and CA<x>. In this manner, the fail address corresponding to each ROWINFO value, which is stored among every fourth one of the fuses 400, 401, . . . , is delivered as the fail address.

Figure 7:
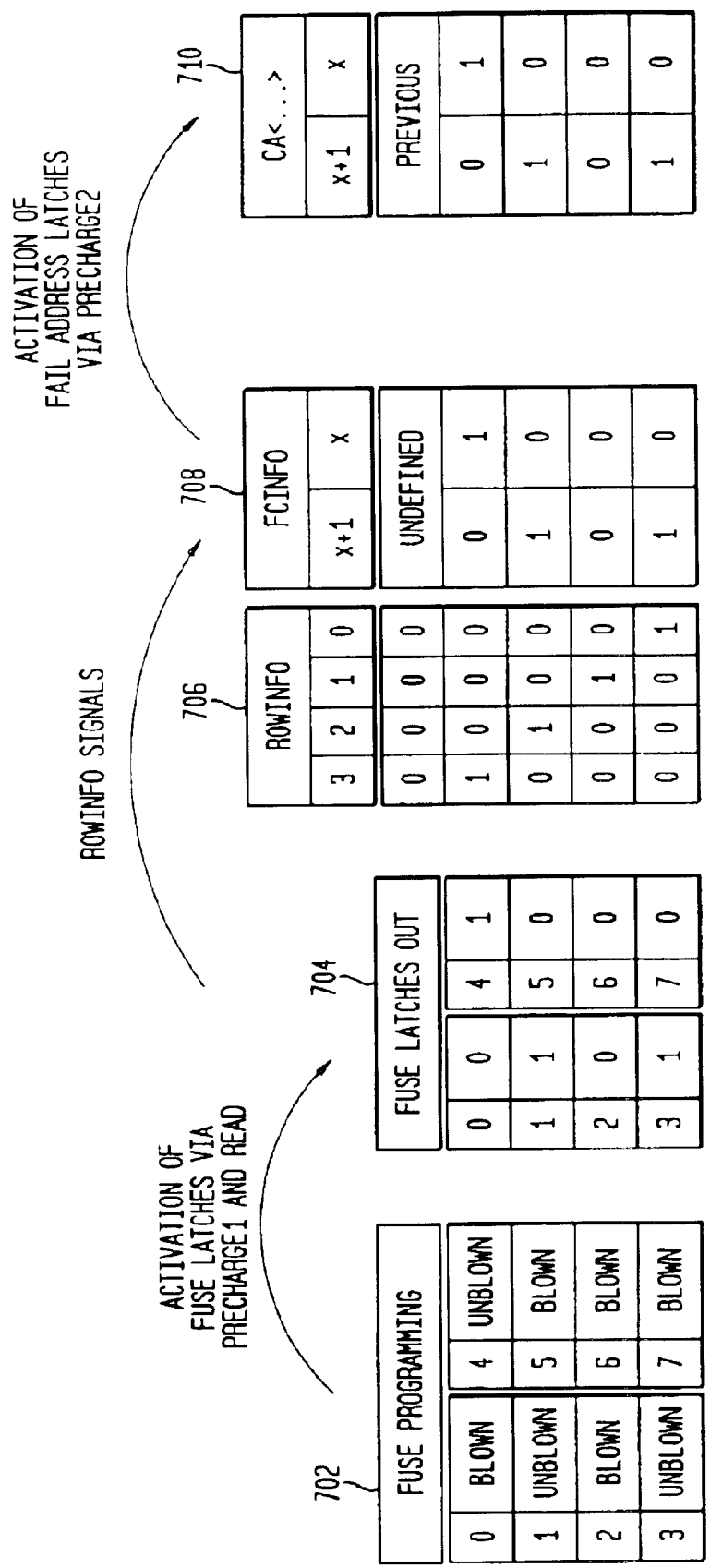
FIG. 7 is a diagram showing an example of fail address values generated by the arrangement shown in FIG. 4 as a function of given fuse values and ROWINFO values.

An example of the operation of the fuse latch arrangement shown in FIG. 4 is illustrated with reference to FIG. 7 which shows an example of fuse programming 702. Here, the fuses representing bits 0, 2, 5, 6 and 7 (fuses 400, 402, 405, 406 and 407) are in an open or blown state, to store a "0". The remaining fuses, which represent bits 1, 3 and 4 (fuses 401, 403 and 404), remain in an unblown or shorted state to store a "1". After the fuse latches are pre-charged by a first pre-charge signal bFPUP and then a readout signal FPUN is supplied to the gates of the FPUN transistors, the first fuse latch outputs 704 are generated. Next, a signal that represents one of the ROWINFO values 706 is delivered along the corresponding ROWINFO line to the gates of the transistor connected thereto so that the output of every fourth fuse latch 708 is delivered to an FCINFO latch. As an example, when the ROWINFO value is 3, the output from the fuse latches that store the values of bits 0 and 4 are delivered to the FCINFO latches, namely x+1=0 and x=1. Similarly, when the ROWINFO value is 2, the output from the fuse latches that store the values of bits 1 and 5 are delivered, which have the values x+1=1 and x=0. When the ROWINFO value is 1, the output from the fuse latches that store the values of bits 2 and 6 are delivered to the FCINFO latches, namely, x+1=0 and x=0. When the ROWINFO value is 0, the output of the fuse latches that store the values of bits 3 and 7 are delivered to the FCINFO latches so that x+1=1 and x=0.

Thereafter, when the FCINFO latches are activated by second pre-charged signal bFCPRE, the corresponding value 710 are read out as fail address bits CA<x+1> and CA<x>.

Though the generation of only two fail address bits are shown in FIG. 4, as many as thirteen bits may be needed to define a fail address. Thus, a circuit for generating an actual fail address would include as many fuses, latches and transistors as needed to generate all the fail address bits. Namely, four fuses, four FPUN transistors, four fuse latches, four output transistors and one FCINFO latch are needed for each fail address bit generated as output. As a result, for a thirteen bit fail address, fifty two fuses latches and thirteen FCINFO latches are needed. Therefore, the known arrangement shown in FIG. 4 has a disadvantage that a large number of fuse latches and FCINFO latches are needed to define all of the fail addresses of the DRAM. The known arrangement therefore greatly increases the surface area required for the memory chip and also increases the complexity of the memory circuit.

Moreover, because the fuse latches are activated when the memory circuit is powered up, any soft failures that are introduced into the fuse latches remain until the memory circuit is powered down. The soft failures can therefore result in an overall system failure.

Additionally, two pre-charge/readout cycles are required to read out the fail address from the fuses. Namely, a first cycle is required that occurs during power up of the memory circuit and a second cycle is required that occurs whenever a row address is changed, such as when a bank activate or RAS signal is received.

Figure 8:
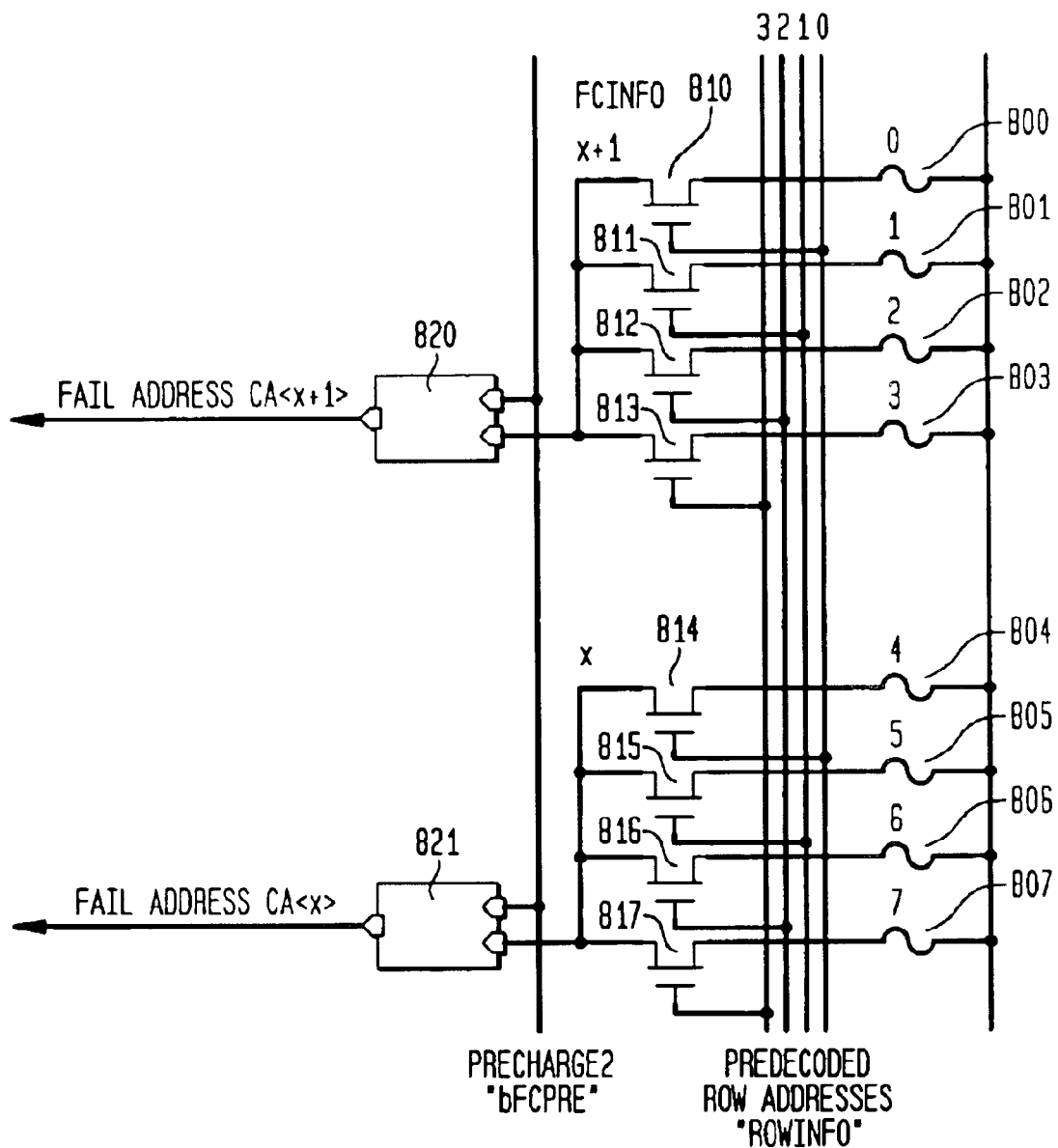
FIG. 8 is a diagram showing an arrangement of fuses and fuse latches in accordance with an embodiment of the invention.

The invention therefore provides a fuse and latch arrangement, shown in FIG. 8, which reduces the number of latches required for each fuse element, reduces the vulnerability to soft failures in the latches, and reduces the time required to read out the values stored in the fuses and generate a fail address. The number of fuse latches is reduced because the ROWINFO information is evaluated before the latches are set, and the values stored in the fuse are only read into the fuse latches based on the ROWINFO signals.

As FIG. 8 shows, fuses 800, 801, 802 and 803 are each coupled to a terminal of corresponding transistors 810, 811, 812, 813, whose other terminal is coupled to an input of fuse latch 820. The gates of transistors 810, 811, 812 and 813 are respectively tied to one of the 0, 1, 2 and 3 lines of the ROWINFO signal lines so that when a signal is delivered over one of the four ROWINFO lines, the corresponding one of transistors 810, 811, 812, 813 is activated and connects one of the fuses to the input of the fuse latch 820. When the fuse latch 820 is pre-charged, such as by pre-charge line bFCPRE, and the one of fuses 800, 801, 802, 803 connected to the fuse latch is in a shorted or unblown state, the charge stored in the fuse latch 820 is discharged across the fuse and causes the output of the fuse latch to change its state. When the pre-charge signal is delivered to the fuse latch and the respective one of fuses 800, 801, 802, 803 is in an open or blown state, the output of the fuse latch 820 does not change. Thus, the one of the four fuse latches 800, 801, 802, 803 whose stored value is read out by the fuse latch 820 is determined by the current ROWINFO value. The output of fuse latch 820 is a fail address bit CA<x+1>.

The state of one of the four fuses 804, 805, 806, 807 is read into fuse latch 821 across the corresponding one of transistors 814, 815, 816, 817 in a similar manner. The output of fuse latch 821 is a fail address bit CA<x>.

Again, the number of arrangements such as are shown in FIG. 8 depends on the number of fail address bits required. Advantageously, however, only one fuse latch is required to generate a fail address bit, rather than the five required in the arrangement shown in FIG. 4, and only four transistors are required in place of the eight transistors required in the arrangement shown in FIG. 4.

Figure 9:
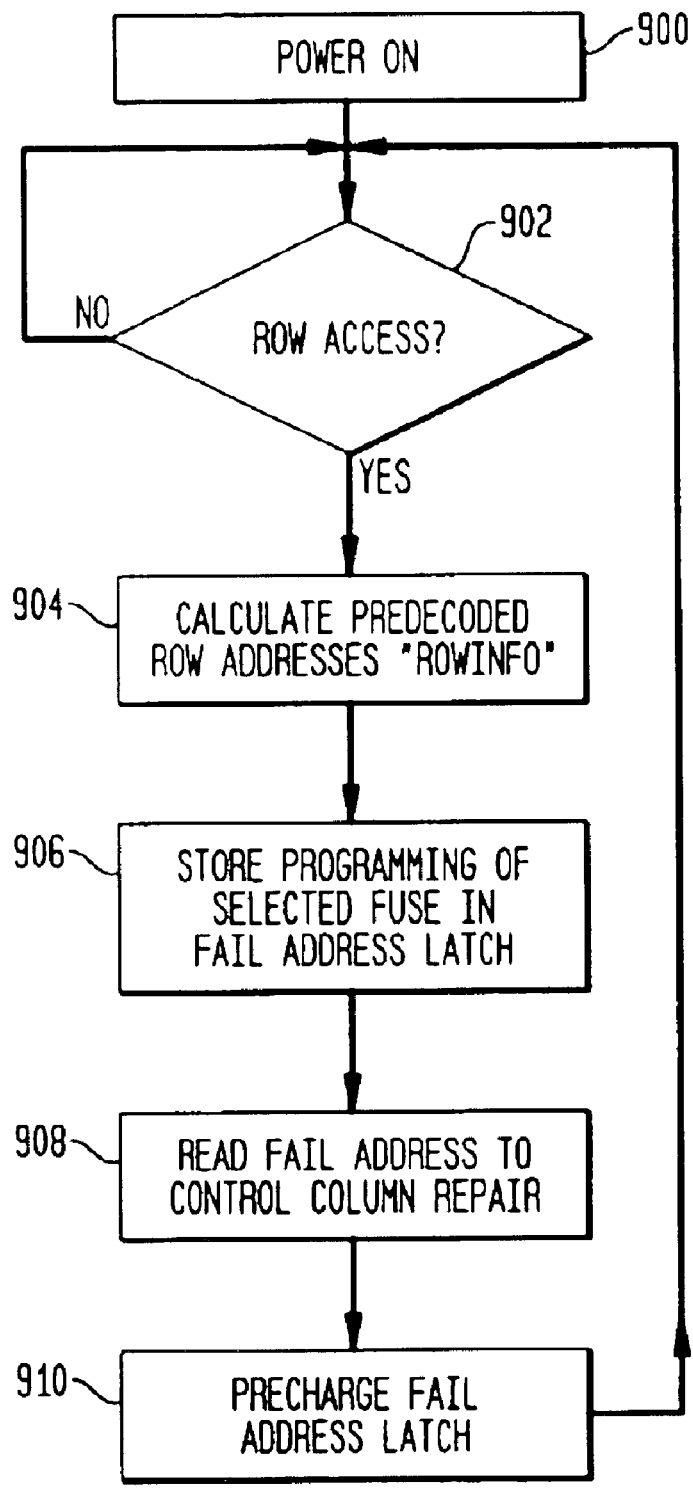
FIG. 9 is a flow chart illustrating the operation of the circuit shown in FIG. 8.

FIG. 9 is a diagram illustrating the operation of the circuit shown in FIG. 8. First, as shown at step 900, power is supplied to the fuse latches 820, 821, such as by pre-charge line bFCPRE. Next, when an address of the row that is to be accessed is received by the control circuit 202, as step 902 shows, the generator circuit 212 generates a ROWINFO value from the row address in the manner described above with reference to FIG. 6, as shown at step 904. Then, a signal representing the ROWINFO value is delivered along its corresponding ROWINFO signal line and activates the transistors connected to it so that the value held in a corresponding one of the fuses is delivered to and stored in the fuse latch, as shown at step 906. Thereafter, the fail address bits are read out, as step 908 shows, so that the failed portion of the memory circuit is replaced with a redundant portion. Finally, the fuse latches 820, 821 are pre-charged by activating the pre-charge line bFCPRE, as shown at step 910.

Figure 10:
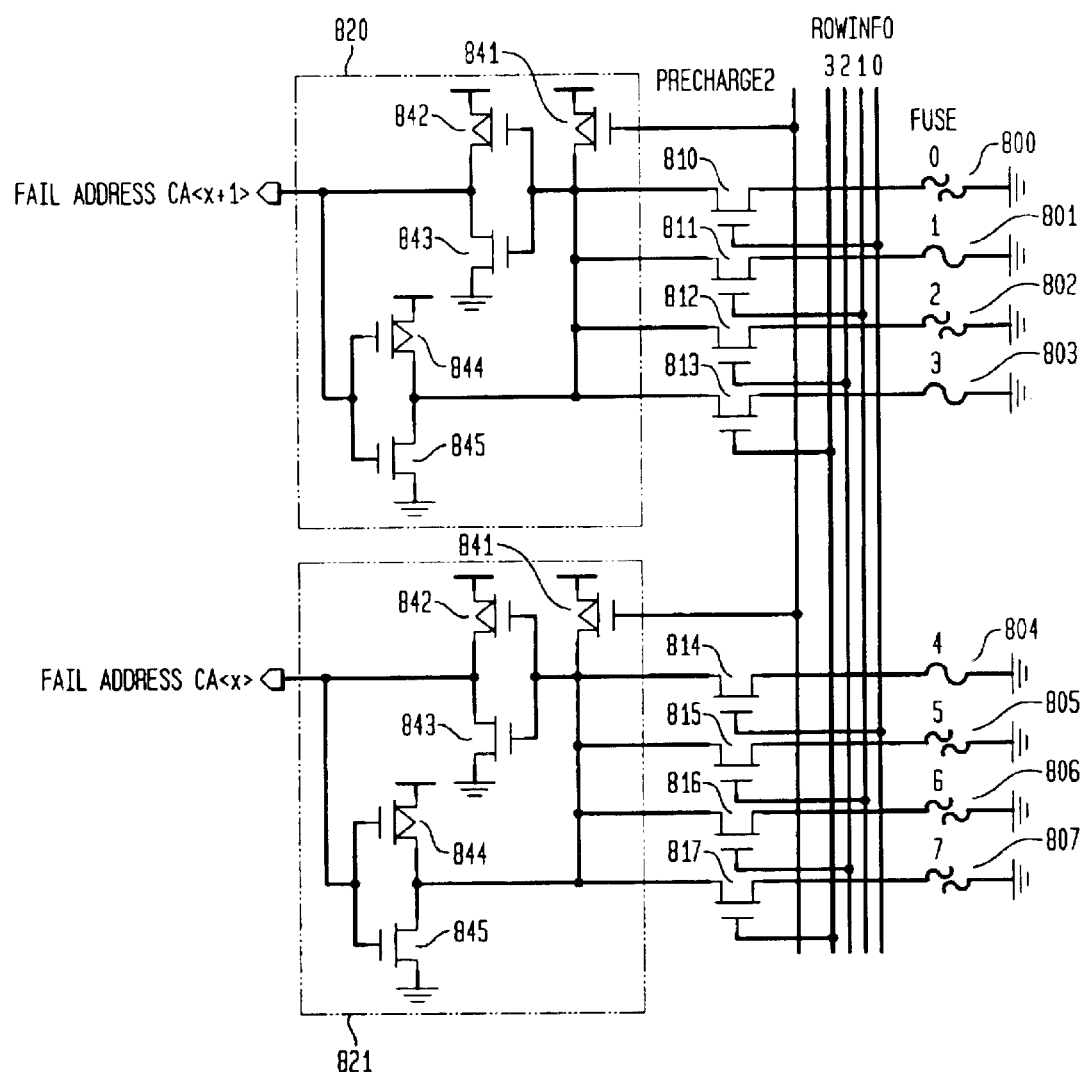
FIG. 10 is a diagram showing the arrangement of FIG. 8 in greater detail and showing an example of fuse programming.

FIG. 10 illustrates an example of the arrangement shown in FIG. 8 in which like numbers represent the same elements except that fuses 800, 802, 805, 806 and 807 are shown in an open or blown state and fuses 801, 803 and 804 are shown in a shorted or unblown state. Also, in FIG. 10, an example of the circuitry that comprises the fuse latches 820 and 821 is shown in greater detail, though other known arrangements are also possible.

Figure 11:
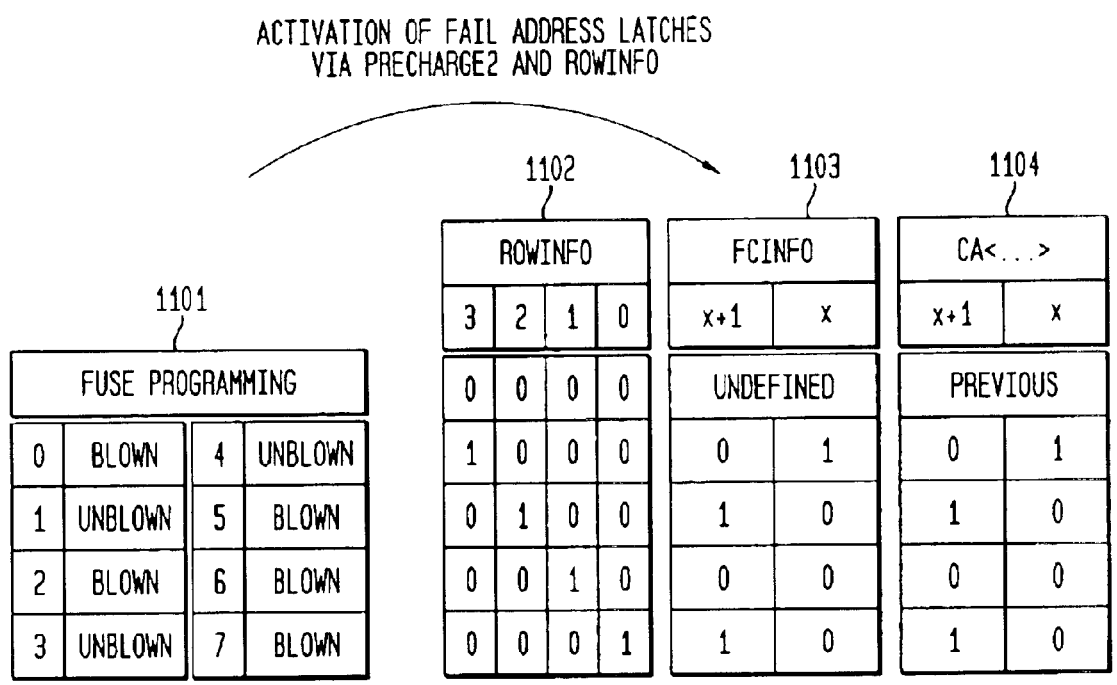
FIG. 11 is a diagram showing fail address output of the arrangement shown in FIG. 10 latches for given ROWINFO values.

FIG. 11 illustrates the values generated by an example of the programming 1101 of the fuses corresponding to the states of fuses shown in FIG. 10. Hence, fuses 0, 2, 5, 6 and 7, which correspond to fuses 800, 802, 805, 806, 807 shown in FIG. 10, are in a blown state and represent a value of "0". Fuses 1, 3 and 4 which correspond to fuses 801, 803 and 804 shown in FIG. 10, are in an unblown state and represent a value of "1". When a ROWINFO value 1102 is delivered to its corresponding signal line, which activates connected ones of the transistors, and a pre-charge signal is delivered, which stores the delivered values in the fuse latches, a FCINFO value 1103 is stored in the fuse latch based on the ROWINFO value and the state of the fuse activated by the ROWINFO signal. The same value is outputted as a fail address bit 1104.

Advantageously, the arrangement of fuses and fuse latches of the invention significantly reduces the overall number of fuse latches required to implement column redundancy. Typically, a four-fold or eight-fold reduction in the number of fuse latches is attained. Additionally, only one-half as many transistors are needed in the arrangement of the invention. Moreover, the arrangement of the invention does not require FPUN or bFPUP signals and therefore does not require power-on circuitry to generate these signals or wiring to deliver such signals.

Further, the fuse latches of the arrangement of the invention only temporarily store a subset of the information stored in the fuses, whereas the known arrangement permanently stores all of the information stored in the fuses. Because information is stored only temporarily, soft failures that occur in the fuse latches likewise exist only temporarily so that overall system failure is averted. Additionally, the arrangement of the invention eliminates the need to re-read the fuse latches after a power-down or after a standby mode because the fuse latches are read with the first bank activate command after the device resumes operation, thereby reducing power consumption. Additionally, the fuse latches are only activated when needed, further reducing power consumption.

Though the present invention is explained in terms of a memory device and, more particularly, in terms of a DRAM, similar arrangements may be adapted to other types of memory devices, such as SRAM devices, other types of logic devices or combinations thereof. Further, though the invention relates to the replacing of one or more defective bit lines that are divided into sub-arrays defined by row addresses, the invention is similarly applicable to the replacing of defective wordlines that are divided into sub-arrays defined by column addresses.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of delivering address information representing failed elements in an array portion of a device; said method comprising:
    storing respective fail address bit values in a plurality of fuses;
    receiving a signal associated with a respective value of a portion of a further address;
    delivering, when said signal is received, one of said fail address bit values from one of said plurality of fuses to a corresponding latch circuit, said latch circuit receiving fail address bit values from at least two of said plurality of fuses, said one of said fail address bit values being selected based on said value associated with said signal; and
    activating said latch circuit to deliver said fail address bit value.

2. The method of claim 1 wherein said storing step stores fail address bit values representing at least two fail addresses.

3. The method of claim 1 wherein said storing step stores fail address bit values representing at least a portion of a column address.

4. The method of claim 1 wherein said further address is a row address.

5. The method of claim 1 wherein said signal is associated with one of four respective values of a two-bit long portion of said further address.

6. The method of claim 1 wherein said latch circuit receives fail address bit values representing one of at least two fail addresses.

7. The method of claim 1 wherein said signal is received when said further address is received by said device.

8. The method of claim 1 wherein said delivering step delivers at least two of said fail address bit values from at least two of said plurality of fuses to at least two corresponding latch circuits.

9. The method of claim 1 wherein said activating step activates said latch circuit upon receipt of a further signal.

10. A method of delivering address information representing failed elements in an array portion of a device; said method comprising:
    storing respective fail address bit values in a plurality of fuses, said fail address bit values representing up to four column addresses;
    receiving, when a row address is received by said device, a signal associated with a respective value of a portion of said row address, said signal being associated with one of four respective values of a two-bit long portion of said row address;
    delivering, when said signal is received, one of said fail address bit values from one of said plurality of fuses to a corresponding latch circuit, said latch circuit receiving fail address bit values from four of said plurality of fuses, said one of said fail address bit values being selected based on said value associated with said signal; and
    activating, upon receipt of a further signal, said latch circuit to deliver said fail address bit value.

11. A circuit for delivering address information representing failed elements in an array portion of a device; said circuit comprising:
    a plurality of fuses each operative to store a respective fail address bit value;
    a plurality of signal lines each associated with a respective value of a portion of a further address;
    a plurality of switches each having an input terminal coupled to a corresponding one of said plurality of fuses, a control terminal coupled to an associated one of said plurality of signal lines, and an output terminal; and
    at least one latch circuit having a first input coupled to said output of at least two of said plurality of switches and a second input coupled to a pre-charge line, such that when a signal is delivered over a respective one of said plurality of signal lines to said control terminal of said associated one of said plurality of switches, one of said plurality of fail address bit values is delivered from one of said at least two fuses to said first input of said latch circuit, and when a pre-charge signal is then delivered over said pre-charge line to said second input of said latch circuit, said fail address bit value is outputted by said latch circuit.

12. The circuit of claim 11 wherein said plurality of fuses store fail address bit values representing at least two fail addresses.

13. The circuit of claim 11 wherein said respective fail address bit value is a portion of a column address.

14. The circuit of claim 11 wherein said further address is a row address.

15. The circuit of claim 11 wherein said plurality of signal lines comprises four signal lines each representing a respective value of a two-bit long portion of said further address.

16. The circuit of claim 11 wherein said plurality of switches comprises a transistor and said control terminal comprises a gate terminal.

17. The circuit of claim 11 wherein said first input of said latch circuit receives fail address bit values representing one of at least two fail addresses.

18. The circuit of claim 11 wherein said first input of said latch circuit is coupled to up to four of said plurality of switches.

19. The circuit of claim 11 wherein said signal is delivered over said respective one of said plurality of signal lines when said further address is received by said device.

20. A circuit for delivering address information representing failed elements in an array portion of a device; said circuit comprising:

a plurality of fuses each operative to store a respective fail address bit value, said plurality of fuses store fail address bit values representing at least up to four column addresses;

four signal lines each representing a respective value of a two-bit long portion of a row address;

a plurality of transistor switches each having an input terminal coupled to a corresponding one of said plurality of fuses, a gate terminal coupled to an associated one of said plurality of signal lines, and an output terminal; and a plurality of latch circuits each having a first input coupled to said output of up to a corresponding four of said plurality of switches and a second input coupled to a pre-charge line, such that when a signal is delivered over a respective one of said plurality of signal lines to each gate terminal of associated ones of said plurality of switches, a respective one of said plurality of fail address bit values is delivered to said first input of each of said plurality of latch circuits from one of its corresponding fuses, and when a pre-charge signal is then delivered over said pre-charge line to each second input of said plurality of latch circuits, each of said plurality of latch circuits delivers its respective fail address bit value.

21. A memory circuit comprising:

a memory array;

a control circuit operable to receive at least one row address value and at least one column address value;

a word line controller operable to receive said row address value from said control circuit and to activate a row of said memory array corresponding to said row address value;

a bit line controller operable to receive said column address value from said control circuit;

a generator circuit operable to receive said row address value address value from said control circuit and to generate a further value based on a portion of said row address value; and a fuse latch circuit comprising:

a plurality of fuses each operative to store a respective fail address bit value, a plurality of signal lines each associated with a respective one of said further values, a plurality of switches each having an input terminal coupled to a corresponding one of said plurality of fuses, a control terminal coupled to an associated one of said plurality of signal lines, and an output terminal, and a plurality of latch circuits each having a first input coupled to said output of at least a corresponding two of said plurality of switches and a second input coupled to a pre-charge line, such that when a signal is delivered over a respective one of said plurality of signal lines to each control terminal of associated ones of said plurality of switches, a respective one of said plurality of fail address bit values is delivered to said first input of each of said plurality of latch circuits from one of its corresponding fuses, and when a pre-charge signal is then delivered over said pre-charge line to each second input of said plurality of latch circuits, each of said plurality of latch circuits delivers its respective fail address bit value to said bit line controller;

said bit line controller activating a column of said memory array corresponding to said column address value when a fail address comprised of said fail address bit values differs from said column address value, said bit line controller activating a redundant column of said memory array when said fail address is said column address value.

22. The circuit of claim 21 wherein said plurality of fuses store fail address bit values representing at least two column addresses.

23. The circuit of claim 21 wherein said plurality of signal lines comprises four signal lines each representing a respective value of a two-bit long portion of said row address.

24. The circuit of claim 21 wherein said plurality of switches comprises a transistor and said control terminal comprises a gate terminal.

25. The circuit of claim 21 wherein said first input of each of said plurality of latch circuits latch circuit receives fail address bit values representing one of at least two column addresses.

26. The circuit of claim 21 wherein said first input of each of said plurality of latch circuits is coupled to up to four of said plurality of switches.

27. A memory circuit comprising:

a memory array;

a control circuit operable to receive at least one row address value and at least one column address value;

a word line controller operable to receive said row address value from said control circuit and to activate a row of said memory array corresponding to said row address value;

a bit line controller operable to receive said column address value from said control circuit;

a generator circuit operable to receive said row address value address value from said control circuit and to generate a further value based on a two-bit long portion of said row address value; and a fuse latch circuit comprising:

a plurality of fuses each operative to store a respective fail address bit value, said plurality of fuses store fail address bit values representing at least up to four column addresses;

four signal lines each representing a respective value of said further values;

a plurality of transistor switches each having an input terminal coupled to a corresponding one of said plurality of fuses, a control terminal coupled to an associated one of said plurality of signal lines, and an output terminal; and a plurality of latch circuits each having a first input coupled to said output of up to a corresponding four of said plurality of switches and a second input coupled to a pre-charge line, such that when a signal is delivered over a respective one of said plurality of signal lines to each gate terminal of associated ones of said plurality of switches, a respective one of said plurality of fail address bit values is delivered to said first input of each of said plurality of latch circuits from one of its corresponding fuses, and when a pre-charge signal is then delivered over said pre-charge line to each second input of said plurality of latch circuits, each of said plurality of latch circuits delivers its respective fail address bit value.

* * * * *